United States Patent
Bae et al.

(10) Patent No.: US 7,705,347 B2
(45) Date of Patent: Apr. 27, 2010

(54) N-TYPE CARBON NANOTUBE FIELD EFFECT TRANSISTOR AND METHOD OF FABRICATING THE SAME

(75) Inventors: Eun-ju Bae, Yongin-si (KR); Yo-sep Min, Yongin-si (KR); Wan-jun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 178 days.

(21) Appl. No.: 12/107,318

(22) Filed: Apr. 22, 2008

(65) Prior Publication Data
US 2008/0191280 A1 Aug. 14, 2008

Related U.S. Application Data

(62) Division of application No. 11/192,107, filed on Jul. 29, 2005, now Pat. No. 7,381,983.

(30) Foreign Application Priority Data
Oct. 2, 2004 (KR) ............... 10-2004-0078544

(51) Int. Cl.
H01L 35/24 (2006.01)
(52) U.S. Cl. .................. 257/40; 438/82; 977/938
(58) Field of Classification Search .......... 257/40; 438/82; 977/938
See application file for complete search history.

(56) References Cited

U.S. PATENT DOCUMENTS

| 6,723,624 B2 | 4/2004 | Wang et al. |
| 7,115,916 B2 | 10/2006 | Avouris et al. |
| 7,253,434 B2 | 8/2007 | Golovchenko et al. |
| 2003/0122133 A1 | 7/2003 | Choi et al. |
| 2004/0023431 A1 | 2/2004 | Wang et al. |

FOREIGN PATENT DOCUMENTS

JP 2004-083402 (A) 3/2004

OTHER PUBLICATIONS

Dinkar V. Singh et al., "Frequency Response of Top-Gated Carbon Nanotube Field-Effect Transistors", IEEE Transactions on Nanotechnology, Sep. 2004, vol. 3, No. 3, pp. 383-387.
R. Martel Avouris et al., "Carbon Nanotube Transistors and Logic Circuits", Physica B 323, 2002, pp. 6-14.

Primary Examiner—Douglas M Menz
(74) Attorney, Agent, or Firm—Harness, Dickey & Pierce, P.L.C.

(57) ABSTRACT

Provided are an n-type carbon nanotube field effect transistor (CNT FET) and a method of fabricating the n-type CNT FET. The n-type CNT FET may include a substrate; electrodes formed on the substrate and separated from each other; a CNT formed on the substrate and electrically connected to the electrodes; a gate oxide layer formed on the CNT; and a gate electrode formed on the gate oxide layer, wherein the gate oxide layer contains electron donor atoms which donate electrons to the CNT such that the CNT may be n-doped by the electron donor atoms.

13 Claims, 5 Drawing Sheets

N-TYPE CARBON NANOTUBE FIELD EFFECT TRANSISTOR AND METHOD OF FABRICATING THE SAME

CROSS-REFERENCE TO RELATED APPLICATIONS

This application claims the benefit of Korean Patent Application No. 10-2004-0078544, filed on Oct. 2, 2004, in the Korean Intellectual Property Office, and as a divisional application of U.S. application Ser. No. 11/192,107, filed Jul. 29, 2005, the entire contents of which are incorporated herein by reference.

1. Field of the Disclosure

Embodiments of the present disclosure relate to a field effect transistor (FET) having n-doped carbon nanotube (CNT) and a method of fabricating the n-type CNT FET, and more particularly, to an n-type CNT FET having n-doped CNT which may be manufactured by adsorbing electron donor atoms on a CNT layer and a method of fabricating the n-type CNT FET.

2. Description of the Related Art

CNTs have excellent mechanical and chemical properties and may have a long length of up to one micrometer with a diameter ranging from several nanometers to several tens of nanometers. CNTs have excellent electrical conductivity and may be applied to electronic devices. Vigorous research has been conducted on the use of CNTs in various devices and they are now used in electric field emission devices, optical switches in the field of optical communication, biodevices, etc.

Methods of manufacturing CNTs are well known in the art. Examples include arc discharge, pulsed laser vaporization, chemical vapor deposition, screen printing and spin coating.

To use CNTs in a semiconductor device, such as a complementary metal-oxide-semiconductor (CMOS) transistor, p-type and n-type MOS transistors are required. In general, CNTs are easily to be hole-doped (p-type doped).

U.S. Patent Application Publication No. 2003-122,133 describes a method of manufacturing an n-type nanotube using an oxygen or potassium ion as a dopant. However, an oxygen molecule cannot be easily decomposed into oxygen atoms and it is difficult to handle potassium ions.

To overcome these problems, U.S. Pat. No. 6,723,624 suggests another n-type doping method. In this method, silicon nitride ($SiN_x$) is deposited on the CNT using plasma-enhanced chemical vapor-phased deposition (PECVD), and then heated, thereby manufacturing an n-type (electron-doped) CNT.

SUMMARY OF THE DISCLOSURE

Embodiments of the present disclosure may provide a field effect transistor (FET) having n-doped CNT which may be manufactured by forming a gate oxide layer containing electron donor atoms on a CNT layer, which may be a channel region, and a method of fabricating the n-type CNT FET.

According to an aspect of the present disclosure, there may be provided an n-type CNT FET comprising: a substrate; electrodes formed on the substrate and separated from each other; a CNT formed on the substrate and electrically connected to the electrodes; a gate oxide layer formed on the CNT; and a gate electrode formed on the gate oxide layer, wherein the gate oxide layer may contain electron donor atoms which donate electrons to the CNT such that the CNT may be n-doped by the electron donor atoms.

The gate oxide layer may be formed by depositing an oxide or a nitride containing a group V atom using an atomic layer deposition (ALD) process.

The group V atom may be bismuth.

The oxide may be bismuth titanium silicon oxide (BTSO).

According to another aspect of the present disclosure, there may be provided an n-type CNT FET comprising: a conductive substrate; a gate oxide layer formed on the conductive substrate; electrodes formed on the gate oxide layer and separated from each other; and a CNT formed on the gate oxide layer and electrically connected to the electrodes; wherein the gate oxide layer contains electron donor atoms which donate electrons to the CNT such that the CNT may be n-doped by the electron donor atoms.

According to still another aspect of the present disclosure, there may be provided a method of fabricating an n-type CNT FET comprising: forming electrodes separated from each other on a substrate; forming a CNT on the substrate such that the CNT may be electrically connected to the electrodes; forming a gate oxide layer on the CNT by depositing an oxide or a nitride containing electron donor atoms; forming a gate electrode on the gate oxide layer, wherein the CNT may be n-doped by the electron donor atoms.

According to yet another aspect of the present invention, there may be provided a method of fabricating an n-type CNT FET, comprising: forming a gate oxide layer on a conductive substrate by depositing an oxide or a nitride containing electron donor atoms on the substrate; forming electrodes separated from each other on the gate oxide layer; and forming a CNT on the gate oxide layer such that the CNT may be electrically connected to the electrodes, wherein the CNT may be n-doped by the electron donor atoms.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF EXEMPLARY EMBODIMENT OF THE DISCLOSURE

Hereinafter, an n-type carbon nanotube field effect transistor (CNT FET) having an n-type CNT and a method of fabricating the n-type CNT FET according to embodiments of the disclosure will be described in detail with reference to the attached drawings.

Figure 1:
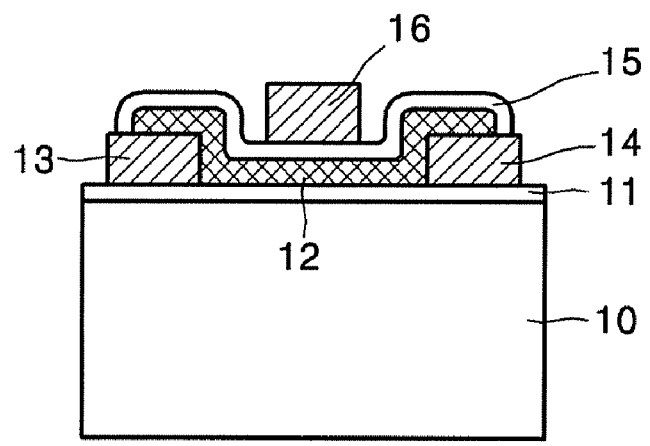
FIG. 1 is a cross-sectional view of an n-type carbon nanotube field effect transistor (CNT FET) according to an embodiment of the present invention.

FIG. 1 is a cross-sectional view of an n-type CNT FET according to an embodiment of the disclosure.

Referring to FIG. 1, an insulating layer 11 may be formed on a substrate 10. A CNT 12 may be formed on the insulating layer 11 and electrodes 13 and 14 may be formed on both ends of the CNT 12, respectively. The electrodes 13 and 14 may function as a drain region and a source region, respectively, and the CNT 12 may function as a channel region.

A gate oxide layer 15 may cover the CNT 12 and a gate electrode 16 may be formed on the gate oxide layer 15, between the electrodes 13 and 14.

The gate oxide layer 15 may be formed of an oxide or a nitride and may function as an electron donor layer. The gate oxide layer 15 may contain a group V atom, such as N, P, As, Sb or Bi. The gate oxide layer 15 may be composed of bismuth titanium silicon oxide (BTSO) and may be formed using an atomic layer deposition (ALD) process. When the CNT 22 is deposited on the BTSO layer, the bismuth may donate electrons to the CNT 12, thereby n-doping a surface of the CNT 12. The electronic device illustrated in FIG. 1 is a top gate n-type CNT FET.

Figure 2:
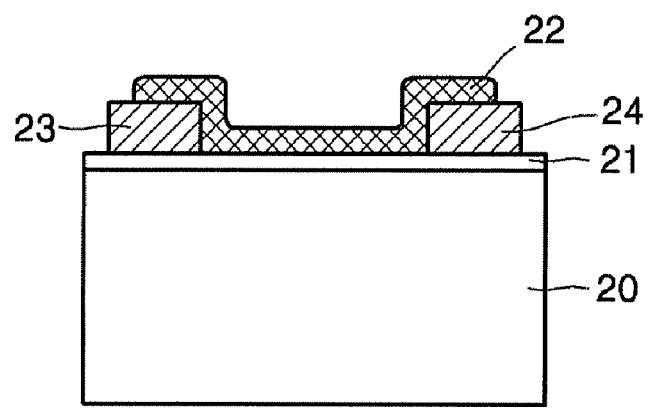
FIG. 2 is a cross-sectional view of an n-type CNT FET according to another embodiment of the present invention.

FIG. 2 is a cross-sectional view of an n-type CNT FET according to another embodiment of the present disclosure.

Referring to FIG. 2, a gate oxide layer 21 may be formed on a conductive substrate 20, for example, a highly doped silicon wafer. A CNT 22 may be formed on the gate oxide layer 21 and electrodes 23 and 24 may be formed below both ends of the CNT 22, respectively. The electrodes 23 and 24 may function as a drain region and a source region, respectively, and the CNT 22 may function as a channel region. The conductive substrate 20 functions as a gate electrode.

The gate oxide layer 21 may be formed of an oxide or a nitride and may function as an electron donor layer. The gate oxide layer 21 may contain a group V atom, such as N, P, As, Sb or Bi. The gate oxide layer 21 may be composed of BTSO and may be formed using an ALD process. When the BTSO layer is deposited on the CNT 22, the bismuth may donate electrons to the CNT 22, thereby n-doping a surface of the CNT 22. The electronic device illustrated in FIG. 2 is a bottom gate n-type CNT FET.

Figure 3:
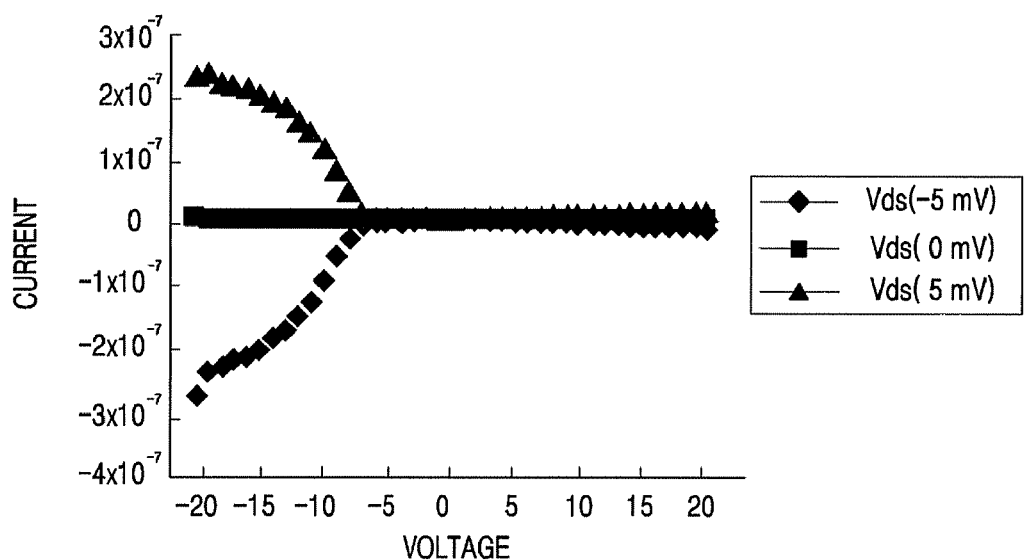
FIGS. 3 and 4 are I-V graphs of CNT FETs before and after the deposition of bismuth titanium silicon oxide (BTSO)
Figure 4:
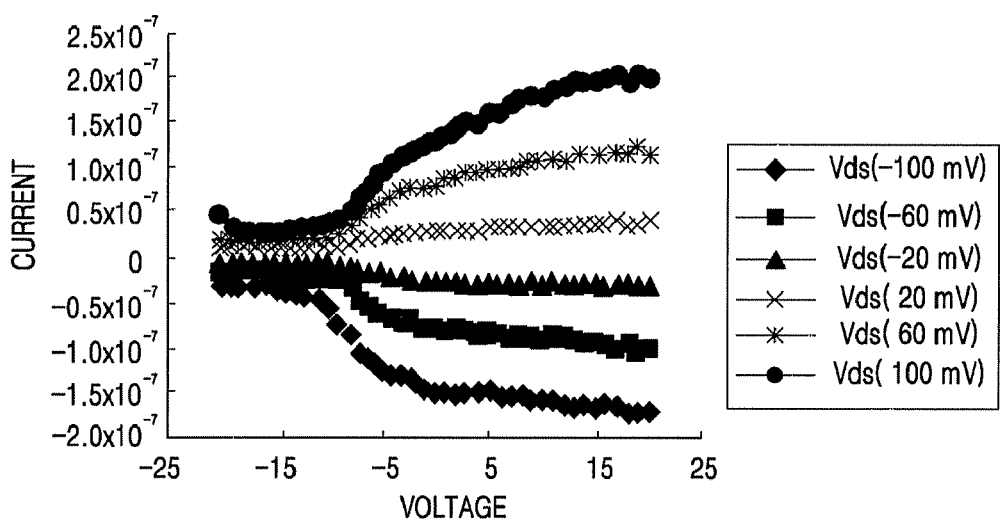

FIGS. 3 and 4 are I-V graphs of CNT FETs before and after the deposition of BTSO, respectively.

Referring to FIG. 3, CNT before deposition of BTSO may be slightly p-doped. When a voltage $V_{ds}$ is applied to a drain electrode and a source electrode and a gate bias voltage $V_g$ is applied in the negative direction, the transistor may be turned on. Thus, the CNT may exhibit p-type characteristics.

Referring to FIG. 4, CNT after deposition of BTSO may be n-doped. When a voltage $V_{ds}$ is applied to a drain electrode and a source electrode and a gate bias voltage $V_g$ is applied in the positive direction, the transistor may be turned on. Thus, the CNT exhibits n-type characteristics. Thus, the CNT is n-doped by depositing BSTO on the CNT.

FIGS. 5A through 5E are cross-sectional views illustrating a method of fabricating an n-type CNT FET according to an embodiment of the present disclosure.

Figure 5A:
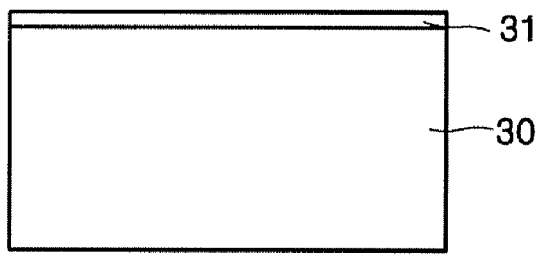
FIGS. 5A through 5E are cross-sectional views illustrating a method of fabricating an n-type CNT FET according to an embodiment of the present invention.

Referring to FIG. 5A, an insulating layer 31, for example, an oxide layer, may be formed on a substrate 30. When the substrate 30 is made of a non-conductive material, the insulating layer 31 may be omitted.

Figure 5B:
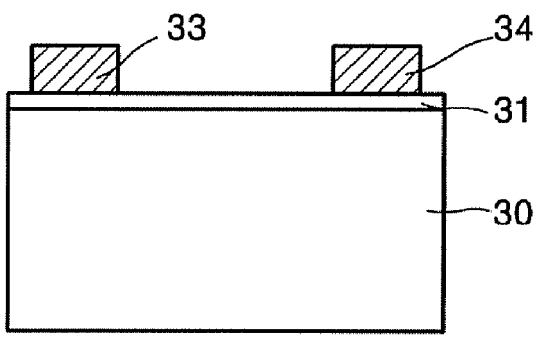

Referring to FIG. 5B, a conductive layer may be formed on the insulating layer 31 and patterned to form a drain electrode 33 and a source electrode 34, which are separated from each other.

Figure 5C:
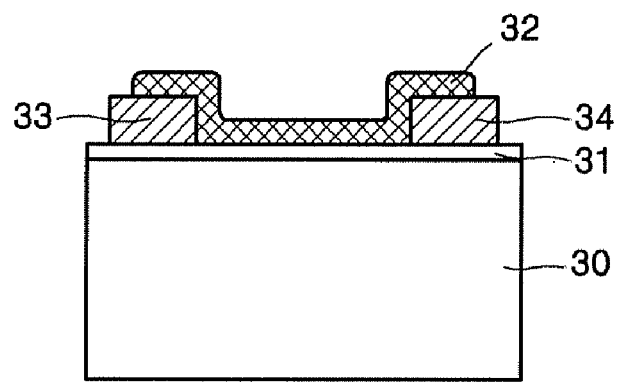

Referring to FIG. 5C, a CNT 32 may be formed on the insulating layer 31 such that the CNT 32 is electrically connected to the electrodes 33 and 34. The CNT 32 may be grown directly on the insulating layer 31 or formed using a conventional method, such as screen printing, spin coating, etc. This CNT 32 may exhibit p-type characteristics.

Figure 5D:
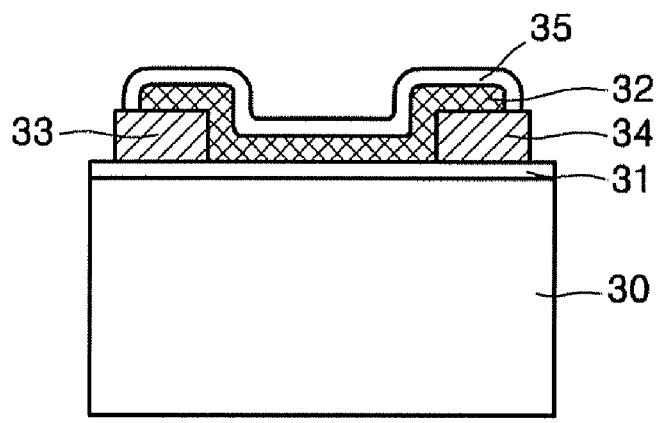

Referring to FIG. 5D, a gate oxide layer 35 may be deposited on the CNT 32. The gate oxide layer 35 may be formed by depositing BTSO using an ALD process at 300° C. Water vapor may be used as an oxygen source. When the BTSO layer is deposited on the CNT 32, electrons from the BTSO layer may be adsorbed by a surface of the CNT 32, and thus, the CNT 32 may be n-doped. Since the gate oxide layer 35 may be used as an electron donor layer, the n-doping may be easily performed in a simplified process.

Although the gate oxide layer 35 may be formed of an oxide in the above description, the composition of the gate oxide layer 35 need not be limited thereto. The gate oxide layer 35 may contain one of N, P, As, Sb and Bi, which are group V atoms.

Figure 5E:
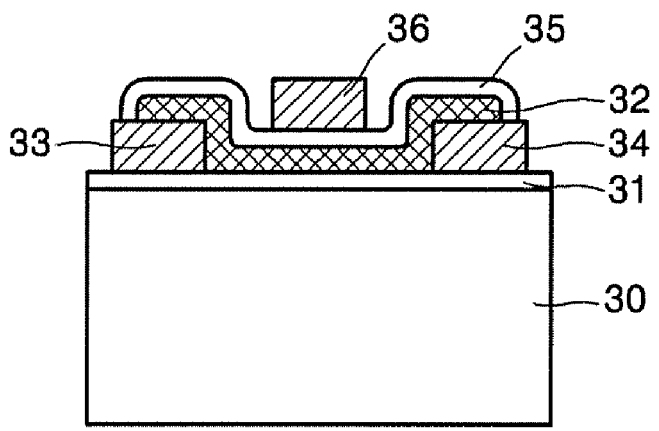

Referring to FIG. 5E, a gate electrode 36 may be formed on the gate oxide layer 35, between the electrodes 33 and 34. The gate electrode 36 may be formed using a patterning process.

Figure 6A:
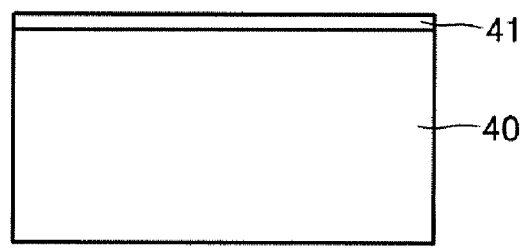
FIGS. 6A through 6C are cross-sectional views illustrating a method of fabricating an n-type CNT FET according to another embodiment of the present invention.
Figure 6B:
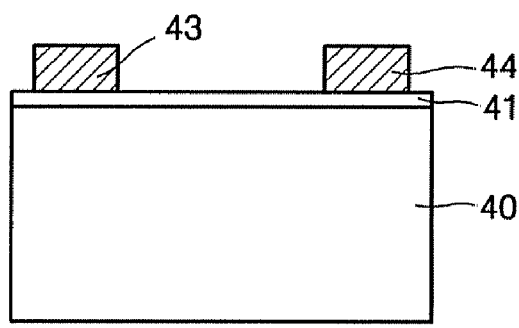
Figure 6C:
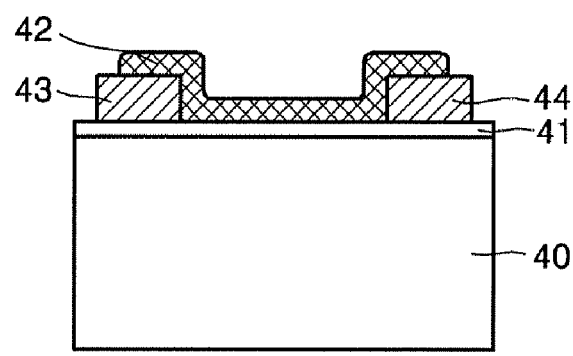

FIGS. 6A through 6C are cross-sectional views illustrating a method of fabricating an n-type CNT FET according to another embodiment of the disclosure.

Referring to FIG. 6A, a gate oxide layer 41 may be formed on a conductive substrate 40, such as a highly doped silicon substrate. The gate oxide layer 41 may be formed by depositing BTSO using an ALD process at about 300° C. Water vapor may be used as an oxygen source.

Referring to FIG. 6B, a conductive layer may be formed on the gate oxide layer 41 and patterned to form a drain electrode 43 and a source electrode 44, which may be separated from each other.

Referring to FIG. 6C, a CNT 42 may be formed on the gate oxide layer 41 by direct growth on the gate oxide layer 41 or using a conventional method, such as screen printing, spin coating, etc. Electrons from the gate oxide layer 41 of the BTSO may be adsorbed by a surface of the CNT 42, which has p-type characteristics, and thus, the CNT 42 may be n-doped.

In the method of fabricating the n-type CNT FET according to the present invention, the CNT may be n-doped using a gate oxide layer which may function as an electron donor layer. Thus, the n-doping may be easily performed in a simplified process.

In addition, in the method of fabricating the n-type CNT FET according to an embodiment of the present disclosure, conventional p-doped CNT may be converted to n-doped CNT, and thus, may be applied to a logic device comprising a p-type device and an n-type device, etc.

While embodiments of the present disclosure have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An n-type CNT FET comprising:
   a conductive substrate;
   a gate oxide layer formed on the conductive substrate;
   electrodes formed on the gate oxide layer and separated from each other; and
   a CNT formed on the gate oxide layer and electrically connected to the electrodes;
   wherein the gate oxide layer contains electron donor atoms which donate electrons to the CNT such that the CNT is n-doped by the electron donor atoms.

2. The n-type CNT FET of claim 1, wherein the gate oxide layer is formed by depositing an oxide or a nitride containing a group V atom using an ALD process.

3. The n-type CNT FET of claim 2, wherein the group VA atom is bismuth.

4. The n-type CNT FET of claim 3, wherein the oxide is BTSO.

5. A method of fabricating an n-type CNT FET comprising:
forming electrodes separated from each other on a substrate;
forming a CNT on the substrate such that the CNT is electrically connected to the electrodes;
forming a gate oxide layer on the CNT by depositing an oxide or a nitride containing electron donor atoms; and
forming a gate electrode on the gate oxide layer,
wherein the CNT is n-doped by the electron donor atoms.

6. The method of claim 5, wherein the gate oxide layer is formed by depositing an oxide or a nitride containing a group V atom using an ALD process.

7. The method of claim 6, wherein the group V atom is bismuth.

8. The method of claim 7, wherein the oxide is BTSO.

9. A method of fabricating an n-type CNT FET, comprising:
forming a gate oxide layer on a conductive substrate by depositing an oxide or a nitride containing electron donor atoms on the substrate;
forming electrodes separated from each other on the gate oxide layer; and
forming a CNT on the gate oxide layer such that the CNT is electrically connected to the electrodes,
wherein the CNT is n-doped by the electron donor atoms.

10. The method of claim 9, wherein the gate oxide layer is formed by depositing an oxide or a nitride containing a group V atom using an ALD process.

11. The method of claim 10, wherein the group V atom is bismuth.

12. The method of claim 11, wherein the oxide is BTSO.

13. An n-type CNT FET comprising:
a substrate;
electrodes formed above the substrate and separated from each other;
a CNT formed above the substrate and electrically connected to the electrodes; and
further comprising, if the substrate is conductive, a gate oxide layer formed between the conductive substrate and the electrodes formed above the substrate and, if the substrate is not conductive, a gate oxide layer formed on the CNT and a gate electrode formed on the gate oxide layer,
wherein the gate oxide layer contains electron donor atoms which donate electrons to the CNT such that the CNT is n-doped by the electron donor atoms.

* * * * *